United States Patent [19]
Hagenauer et al.

[11] Patent Number: 5,729,560
[45] Date of Patent: Mar. 17, 1998

[54] METHOD AND CODING MEANS FOR PROTECTED TRANSMISSION OF DATA ON THE BASIS OF MULTI-COMPONENT CODING

[75] Inventors: Joachim Hagenauer, Seefeld; Frank Burkert, Munich; Martin Werner, Fulda, all of Germany

[73] Assignee: Siemens Aktiengesellschaft, Munich, Germany

[21] Appl. No.: 662,072

[22] Filed: Jun. 12, 1996

[30] Foreign Application Priority Data

Jun. 12, 1995 [DE] Germany ............. 195 21 328.9

[51] Int. Cl.$^6$ ................................. H03M 13/12
[52] U.S. Cl. ................................. 371/43.1
[58] Field of Search ................................. 371/43

[56] References Cited

U.S. PATENT DOCUMENTS

| | | | |
|---|---|---|---|
| 4,802,171 | 1/1989 | Rasky | 371/43 |
| 5,289,501 | 2/1994 | Seshadri et al. | 375/17 |
| 5,446,747 | 8/1995 | Berrou | 371/45 |
| 5,467,132 | 11/1995 | Fazel et al. | 348/390 |

FOREIGN PATENT DOCUMENTS 0 511 141 A1  10/1992  European Pat. Off. .

OTHER PUBLICATIONS

J.G. Proakis, Digital Communications, McGraw–Hill International Editions, (1989), pp. 440–451.

C. Berrou et al, Near Shannon Limit Error–Correcting, Coding and Decoding: Turbo–Codes (1), IEEE Proc. ICC, 1993, pp. 1064–1070.

C. Berrou et al, Procede de Codage Correcteur D'Erreurs a Moins Deux Codages Convolutifs Systematiques en Parallele, Procede de Decodage Interratif, Module de Decodage Correspondents, (1994) pp. 215–227.

J. Hagenauer et al, Iterative (Turbo) Decoding of Systematic Convolutional Codes with Map and Sova Algorithms, (1994) pp. 21–29.

J. Hagenauer et al, Decoding (Turbo) Codes with the Soft Output Viterbi Algorithm (Sova), (1994) pp. 165–165.

P. Robertson, Illuminating the Structure of Code and Decoder of Parallel Concatenated Recursive Systematic (Turbo) Codes, IEEE (1994) pp. 1298–1303.

G. D. Forney, Jr., Convolutional Codes I: Algebraic Structures, IEEE Transactions on Information Theory, vol. 16, No. 6, Nov. (1970), pp. 720–738.

*Primary Examiner*—Stephen M. Baker
*Attorney, Agent, or Firm*—Hill, Steadman & Simpson

[57] ABSTRACT

Method for protected transmission of data with multi-component coding, whereby a non-uniform error protection is achieved by selection of important bits or bit sequences from an information sequence (I), the bit sequences being supplied to further component coders (COD1 through COD3).

10 Claims, 2 Drawing Sheets

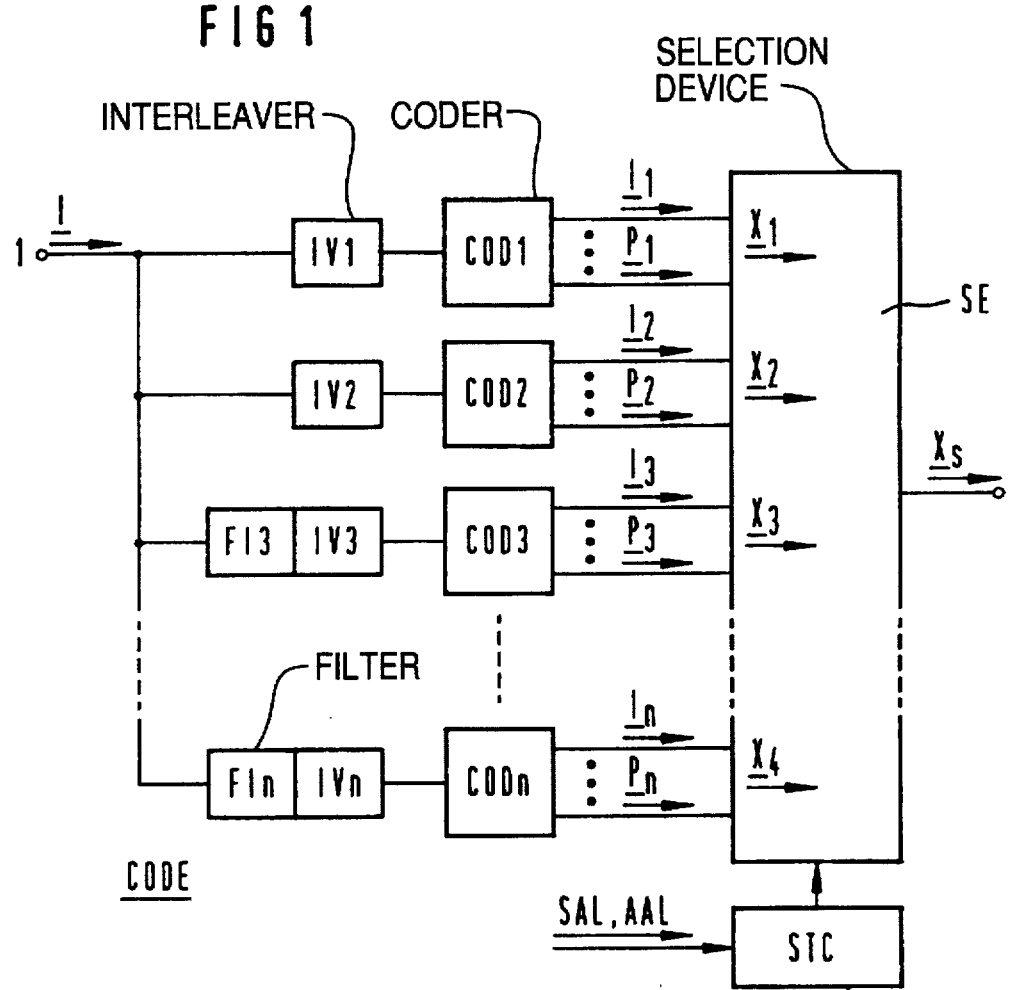
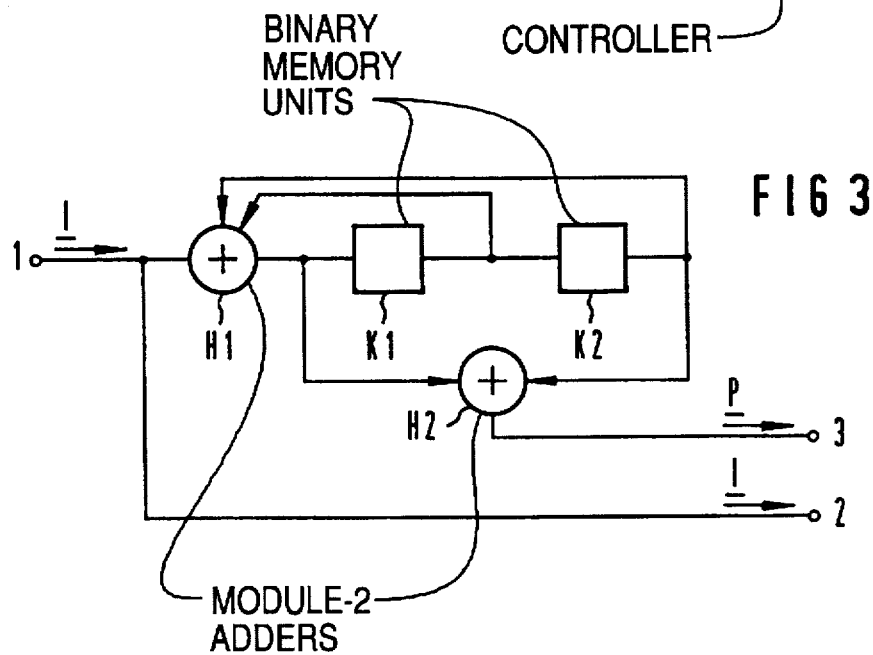

METHOD AND CODING MEANS FOR PROTECTED TRANSMISSION OF DATA ON THE BASIS OF MULTI-COMPONENT CODING

BACKGROUND OF THE INVENTION

The present invention is directed to a method for protected transmission of data.

Disturbances often occur given transmission of information over disturbed data channels. Given binary transmission, these disturbances can invert individual bits or groups of bits. In order to be able to recognize and potentially correct these transmission errors at the reception side, check bits are added to the information bits at the transmission side and are transmitted. An overview of the most widespread methods for channel coding is presented in a reference by J. G. Proakis, "Digital Communications", McGraw-Hill International Editions, 1989.

A reference by C. Berrou discloses a high-performance method for channel coding ("turbo-coding") based on parallel chaining of at least two recursive, systematic convolution codes and their iterative decoding. This coding method and details related thereto are described in detail in the following references: C. Berrou, "Near Shannon limit error-correcting and decoding: Turbo-Codes (1)", Proc. ICC'93, May 1993; European Patent Application, Publication Number 0 511 141A1, Inventor: C. Berrou, "Procédé de codage correcteur d'erreurs à moins deux codages convolutifs systématiques en parallèle, procédé de décodage intératif, module de dé de décodage correspondents"; J. Hagenauer et al., "Iterative ("Turbo") decoding of systematic convolutional codes with MAP and SOVA algorithms", ITG Fachtagung "Codierung", Munich, October 1994; and J. Hagenauer, L. Papke, "Decoding 'Turbo'-Codes with the Soft Output Viterbi Algorithm (SOVA)", 1994 International Symposium on information theory, Trondheim, 1994.

A plurality of chained component codes are generated in parallel in a multi-component coding, what is referred to as turbo-coding. The code rate (the ratio of information bits to the total of information bits and check bits) derives from the code rates of the component codes employed and from a selection rule with which a selection from the code symbols of the generated code sequences ensues. In this way, the code rate can be defined in a broad range. However, the capability of error correction or, respectively, error recognition is closely linked thereto.

European Patent Application Publication Number 0 511 141 selects specific code symbols from the generated code sequences according to a permanently prescribed selection rule (punctuation rule). This rule, of course, is also known to the decoder.

German Published Application DE 34 43 041 A1 discloses a method for improving the transmission quality of image signals that reduces the plurality of information bits given disturbances and instead transmits check bits of an error-correcting code. Transmission and reception means are informed of the respective transmission mode by a return channel. This method, however, cannot be applied in the transmission of data and voice or image signals that have already been reduced since all information bits are required. Various code rates here respectively require a separate coding and decoding means.

SUMMARY OF THE INVENTION

The problem of being able to switch between different error protection levels is solved by the method of the present invention.

In general terms the present invention is a method for protected transmission of information with multi-component coding. Chained information sequences are supplied to a plurality of component coders. Important bits or bit sequences are first selected from the information sequences according to a selection algorithm. These are supplied to further component coders and are protected by further component codes.

Advantageous developments of the present invention are as follows.

The selection algorithm for the important bits can be modified corresponding to different demands.

The selected bits or bit sequences are conducted via interleavers. The scrambling length of the interleavers is controllable.

Convolution codes are employed as component codes.

Single-parity check codes are employed as further component codes.

A different plurality of code symbols are selected from the coded code sequences corresponding to changing demands.

The redundancy is correspondingly non-uniformly distributed over the information bits by "dynamic" selection of code symbols from the coded code sequences.

The present invention is also a coder means for generating a multi-component code with a plurality of component coders. Further component coders are provided that are preceded by filters acting as selection circuits for the selection of important bits or bit sequences.

The present invention is also a decoder means for decoding a multi-component code with a plurality of component decoders. Further component decoders are provided which are preceded by filters acting as selection circuits for the selection of important bits or bit sequences.

The method can be especially advantageously applied when important information or selected bits receive a better error protection with a selectable "dynamic" selection rule by generating additional check bits in further coders than do other information sections or, respectively, bits of less significance.

In order to achieve the selectively improved error protection, some component coders are preceded by filters acting as selectors that only respectively through-connect the more important information bits or information sections to the further coders.

The employment of simple parity codes for the protection of the more important information bits is especially beneficial.

It is advantageous for the selection rule to be written in a memory. An especially flexible coding is particularly possible given an erasable memory (EEPROM) or given a write-read memory (RAM).

This method can be combined with a selectable selection algorithm of the codes code sequences. As a result thereof, the code rate and the error protection connected therewith can be matched in broad ranges to different services and demands without having to implement modifications at the coder or decoder means.

As a result of "dynamic" selection of code symbols (bits) of the coded code sequences within an information sequence, the redundancy can be non-uniformly distributed as needed over the information bits and, thus, the non-uniform error protection can be reinforced.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 is a schematic circuit diagram of an inventive coder means;

FIG. 3 depicts a coder for a recursive systematic code.

DESCRIPTION OF THE PREFERRED EMBODIMENTS

Figure 2:
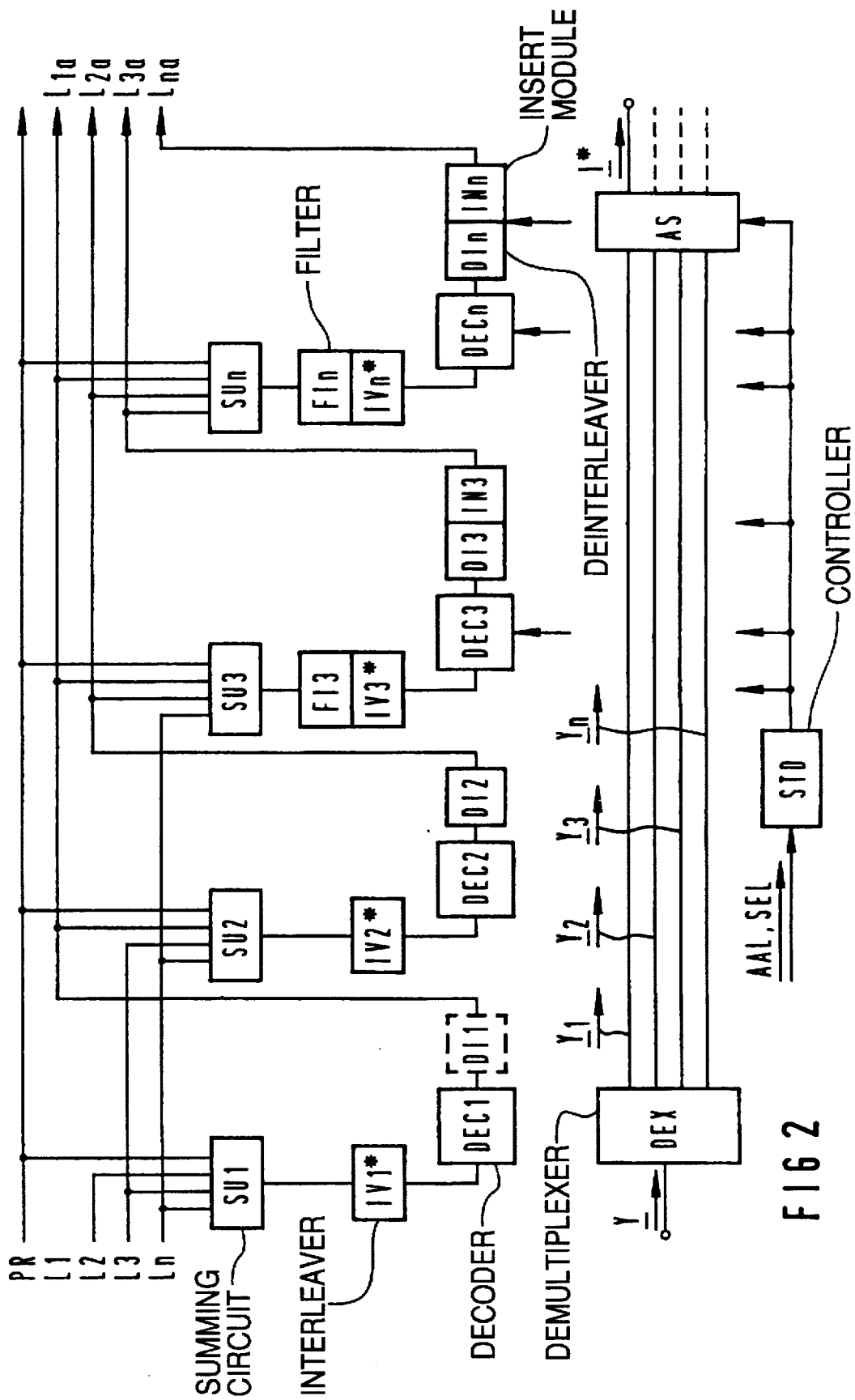
FIG. 2 depicts an appertaining decoder means.

FIG. 1 shows a coder means CODE for generating a "turbo-code". It contains a plurality of component coders COD1 through CODn to which an information sequence I is supplied via interleavers IV1 through IVn. The interleavers have the job of outputting the information bits in a different time sequence. What is thereby to be achieved is that different bits are affected by disturbances in the transmission channel. Identical or different coders as well can be used. The information sequence I supplied to the coder COD1 is output unmodified at the information output 2. The generated check sequence $P_1$ is output at the check output 3 (a plurality of outputs for information bits and check bits can also be respectively provided when the code has a data rate <½). The information sequence I and the check sequence $P_1$ form the first code sequence $X_1$.

The second component coder COD2 generates a code sequence from scrambled information sequence in the same way.

Using further component coders COD3 through CODn and filters FI1 through FIn acting as selectors which precede them, however, the illustrated coder means implements a selection of the more important bits or bit sequences of the information sequence I to be coded and generates further code sequences $X_3$ through $X_n$ for their protection. The selected bits, for example, can be all bits of important data of an information sequence or also the most significant bits of PCM-coded voice signals. The additionally generated code sequences $X_3$ through $X_n$ are likewise transmitted. Connected with less of an error protection for the remaining bits, the overall transmission rate of the output code sequences can be lowered by this adapted coding.

All generated code sequences $X_1$ through $X_n$ are supplied to a selection means SE that selects code symbols of these code sequences (all code symbols as well in special instances). The selection means, which corresponds to a multiplexer, is controlled by the controller STC. In addition to having the criteria for the selection of the important bits that are available, this also has all criteria for the control of the selection.

For a great number of reasons, it is often desirable to realize different code rates. This is essentially achieved by the selection of a different plurality of check bits. For example, a serial code sequence $X_s$ is output in which the bits of the information sequence are usually only contained once.

The selection algorithm AAL for the information bits to be especially protected and the selection algorithm SAL for the generated code sequences are input into a memory M. In conformity with the required flexibility, this can be a RAM or ROM. In some instances, a hardware-oriented wiring can also be employed as "memory".

The modification of the selection rules can ensue both in fixed cycles as well as, for example, given a deteriorating transmission quality during the connection. Likewise, different selections rules can be applied for specific phases of a connection, for example during the call setup.

Taking the properties of the generated component codes into account, the selection algorithm SAL for the generated code sequences is defined, for example, by the type of service used, the frame or block structure, the available data rate, the quality of the transmission channel (about which a controller STC allocated to the coder means is informed via a return channel) and by the demands made of the data protection, etc.

By "dynamic" selection within an information sequence, important bits or bit sequences, for example specific values of binarily coded voice signals, can also be additionally provided with an even greater error protection on the basis of non-uniform allocation of check bits.

FIG. 2 shows an appertaining decoder means DECE that is suitable for decoding the serial code sequence $X_s$. It contains a demultiplexer DEX to which the digitized samples $Y_s$ of the received, serial code sequence (which coincides with the transmitted code sequence $X_s$ in the error-free case) are supplied and which divides them into sequences $Y_1$ through $Y_n$. It also has interleavers IV1* through IVn* working inversely relative to the interleavers, filters FI3* through FIn*, whose selection rule agrees exactly with the selection rule of the filters employed at the encoder side, and a plurality of component decoders DEC1 through DECn corresponding to the component coders that are followed by de-interleavers DI1 through DIn corresponding to the interleavers.

The decoders are supplied with the digitized samples and, via summing circuits SU1 through SUn, with the output from the preceding decoder units and with the extrinsic components $L_1$ through $L_n$ determined in preceding iteration steps. An "a priori information" PR with particulars about the code sequence to be decoded can also be additionally supplied via the summing circuits.

In alternative presentations, the samples corresponding to information bits and the check bits are directly supplied to the first decoder of the decoder means via the first summing means. An interleaver can often be eliminated at a (first) coder and the appertaining decoder. The function of the decoder and the technical structure of the coder and decoder means are known to a person skilled in the art and are adequately described in the literature.

Corresponding to the known strategy of C. Berrou, each component decoder uses only the channel information $Y_1$, $Y_2$, . . . about the code symbols of the received, serial code sequence $Y_s$ that are part of the component code to be decoded. Likewise, each component decoder also uses only the "a priori information" properties about the information bits of precisely this sub-sequence. The component decoders respectively deliver only a current extrinsic information $L_{1a}$ through $L_{na}$ allocated to the corresponding part of the decoded information sequence, this extrinsic information being conducted to the following decoders and improving their decision.

Each de-interleaver DI* corresponding to a respective interleaver IV provided with a filter FI is expanded by an insert module IN3 through INn that inserts zeros into the sequence of the calculated extrinsic information at the positions of the information bits that, due to the selection by the filer, are not elements of the sub-sequence.

Of course, the decoder means DECE must know both selection rules, the selection rules of the filters as well as the scrambling rule of the interleavers. A controller STD allocated to the decoder means sees to a corresponding processing of the received information. The decoding ensues in a plurality of "cycles" wherein the acquired, intermediately stored, current extrinsic information $L_{1a}$ through $L_{na}$ are re-supplied to the summing inputs and the likewise intermediately stored channel information $Y_1$ through $Y_n$ are re-supplied to the decoders. The illustration of delay elements, etc., was eliminated.

The decision regarding which binary value was received ensues on the basis of the extrinsic information, for example EXTn, of the last decoder of the decoder chain. When scrambled information bits are received, then, of course, the scrambling must be reversed (in the output stage AS).

The decoder means can be realized in feedback or pipeline structure in a way that is known per se. Convolution codes, for example, can be employed as component codes. FIG. 3 shows a coder for a recursive systematic code with two binary memory units K1, K2 as well as two modulo-2 adders H1 and H2. Via a data input 1, a respective information sequence $I=I_1, I_2, \ldots I_L$ proceeds bit-by-bit to an input of the first modulo-2 adder H1 to which the bits present in the memory units K1, K2, the coder memory, are also supplied. The result of the modulo-2 addition is supplied to the data input of the first memory unit K1. A check sequence P with check bits P is generated by a further modulo-2 addition of the modulo-2 sum at the output of the first modulo-2 adder H1 and the information adjacent at the output of the second memory unit K2 and is output at the check output 3. The code symbols (bits) adjacent at the outputs 2 and 3 are usually transmitted interleaved bit-by-bit; at further component coders, only the check bits are often output. Coders having more than two memory units are usually employed in realized transmission equipment. The coder operates in a known way with a bit clock signal that is not shown in this schematic circuit diagram.

Single-parity check codes that protect a bit sequence, for example a code word, with a parity bit in a known way are also, for example, especially suited as component codes, particularly for the coders provided with a preceding filter. An error protection similar to a product code is achieved by employing at least two of these component codes.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for protected transmission of information with multi-component coding, comprising the steps of:

supplying chained information sequences to a plurality of component coders, said chained information sequences having code symbols;

selecting important bits or bit sequences from the information sequences according to a selection algorithm;

supplying said selected important bits or bit sequences to further component coders; and protecting said selected important bits or bit sequences with further component codes.

2. The method according to claim 1, wherein the selection algorithm for the important bits is modifiable according to different demands.

3. The method according to claim 1, wherein the selected bits or bit sequences are conducted via interleavers.

4. The method according to claim 3, wherein a scrambling length of the interleavers is controllable.

5. The method according to claim 1, wherein convolution codes are employed as component codes.

6. The method according to claim 1, wherein single-parity check codes are employed as further component codes.

7. The method according to claim 1, wherein a different plurality of code symbols are selected from the coded code sequences for different changing demands.

8. The method according to claim 1, wherein redundancy is non-uniformly distributed over the information bits by dynamic selection of code symbols from the coded code sequences.

9. A coder apparatus for generating a multi-component code for an information sequence having important bits or bit sequences, comprising:

a plurality of first component coders for receiving the information sequence;

a plurality of filters also for receiving the information sequence;

a plurality of second component coders respectively connected to said plurality of filters, said filters functioning as selection circuits for selecting bits from the important bits or sequence of bits;

wherein the plurality of first and second component coders generate a multi-component code for the information sequence.

10. A decoder apparatus for decoding a multi-component code of an information sequence having important bits and bit sequences, comprising:

a plurality of first component decoders for receiving the information sequence;

a plurality of filters also for receiving the information sequence;

a plurality of second component decoders respectively connected to said plurality of filters, said filters functioning as selection circuits for selecting bits from the important bits or sequence of bits;

wherein the plurality of first and second component decoders effect a decoding of the information sequence.

* * * * *